(12) United States Patent
Etschmaier et al.

(10) Patent No.: US 10,723,615 B2
(45) Date of Patent: Jul. 28, 2020

(54) SENSOR ASSEMBLY AND ARRANGEMENT AND METHOD FOR MANUFACTURING A SENSOR ASSEMBLY

(71) Applicant: Sciosense B.V., AE Eindhoven (NL)

(72) Inventors: Harald Etschmaier, Graz (AT); Anderson Singulani, Graz (AT)

(73) Assignee: Sciosense B.V., AE Eindhoven (NL)

( * ) Notice: Subject to any disclaimer, the term of this patent is extended or adjusted under 35 U.S.C. 154(b) by 0 days.

(21) Appl. No.: 16/098,230

(22) PCT Filed: May 5, 2017

(86) PCT No.: PCT/EP2017/060810
§ 371 (c)(1),
(2) Date: Nov. 1, 2018

(87) PCT Pub. No.: WO2017/194417
PCT Pub. Date: Nov. 16, 2017

(65) Prior Publication Data
US 2019/0161340 A1    May 30, 2019

(30) Foreign Application Priority Data
May 10, 2016 (EP) .................... 16169007

(51) Int. Cl.
*B81B 7/00* (2006.01)
*B81B 3/00* (2006.01)

(52) U.S. Cl.
CPC .......... *B81B 7/0048* (2013.01); *B81B 3/0021* (2013.01); *B81B 7/0058* (2013.01);
(Continued)

(58) Field of Classification Search
CPC ... B81B 7/0048; B81B 7/0058; B81B 3/0021; B81B 2203/051; B81B 2203/0127;
(Continued)

(56) References Cited

U.S. PATENT DOCUMENTS

| 6,050,832 A * | 4/2000 | Lee .................. H01L 23/49833 |
| | | 257/E23.063 |
| 7,573,138 B2 | 8/2009 | Lee et al. |

(Continued)

FOREIGN PATENT DOCUMENTS

| EP | 2 679 536 | 1/2014 |
| WO | 2012/037536 | 3/2012 |
| WO | 2015/124432 | 8/2015 |

OTHER PUBLICATIONS

European Patent Office, International Search Report for PCT/EP2017/060810, dated Jul. 19, 2017.

*Primary Examiner* — Marcos D. Pizarro
*Assistant Examiner* — Sue Tang

(57) ABSTRACT

A sensor assembly for being mounted on a circuit board comprises an interposer with at least one opening extending between a first and a second main surface of the interposer. The interposer comprises at least two stress decoupling elements, each comprising a flexible structure formed by a respective portion of the interposer being partially enclosed by one of the at least one opening. A sensor die is connected to the flexible structures on the first main surface. At least two board connection elements are arranged on the first main surface and adapted for connecting the assembly to the circuit board.

20 Claims, 3 Drawing Sheets

(52) U.S. Cl.
CPC ... *B81B 2201/02* (2013.01); *B81B 2201/0264* (2013.01); *B81B 2201/0292* (2013.01); *B81B 2203/0127* (2013.01); *B81B 2203/051* (2013.01)

(58) Field of Classification Search
CPC .... B81B 2201/0292; B81B 2201/0264; B81B 2201/02
See application file for complete search history.

(56) References Cited

U.S. PATENT DOCUMENTS

| | | |
|---|---|---|
| 8,129,801 B2 | 3/2012 | Eskridge |
| 9,250,262 B1 | 2/2016 | Desai et al. |
| 2009/0273698 A1* | 11/2009 | Hsu .................. H01L 27/14618 348/308 |
| 2013/0010145 A1* | 1/2013 | Hagiwara ............ H04N 5/2253 348/222.1 |
| 2013/0168840 A1 | 7/2013 | Merassi et al. |
| 2017/0203958 A1 | 7/2017 | Classsen et al. |

* cited by examiner

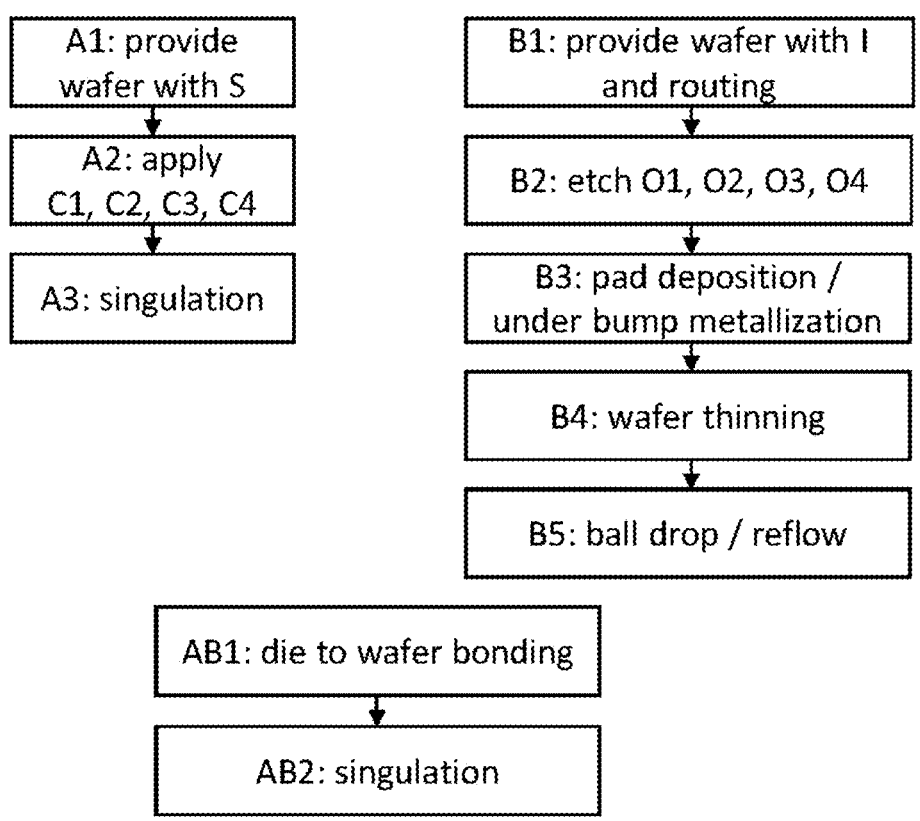

SENSOR ASSEMBLY AND ARRANGEMENT AND METHOD FOR MANUFACTURING A SENSOR ASSEMBLY

BACKGROUND OF THE INVENTION

The disclosure relates to a sensor assembly for being mounted on a circuit board and to a sensor arrangement of a sensor assembly mounted on a circuit board. The disclosure further relates to a manufacturing method for such a sensor assembly.

Sensors, in particular sensor integrated circuits, ICs, may be highly susceptible to the influence of mechanical stress. The stress may be introduced to the system for example by deformation due to external forces. Another source of mechanical stress may be temperature variations or temperature stress for example during application of the sensor or when soldering the sensor system to a circuit board. This may be particularly relevant if packages including materials with different coefficients of thermal expansion, CTEs, are used. Furthermore, also humidity, in particular air humidity, may give rise to deformations for example due to a swelling of the circuit board.

In existing sensor assemblies, the mechanical stress on the sensor die, for example a MEMS device, may be high, leading for example to degradation of the sensor performance or physical damage. Some setups may be difficult to assemble or suffer from increased package costs and/or footprint. Other drawbacks of existing approaches may include an increased package size, in particular package height, decreased robustness and/or a process flow with increased complexity.

SUMMARY OF THE INVENTION

The disclosure provides an improved concept for a sensor system reducing the influence of mechanical stress.

The improved concept is based on the idea of providing a sensor assembly with an interposer having flexible structures or arm structures defined by openings through the interposer. In particular, the flexible structures are formed by portions of the interposer being partially surrounded or enclosed by the openings. A sensor die is connected to the flexible structures. Board connection elements for connecting the sensor assembly to a circuit board are attached to the same side of the interposer as the sensor die.

According to the improved concept, a sensor assembly for being mounted on a circuit board is provided. The sensor assembly comprises an interposer with a first main surface, a second main surface opposite to the first main surface and at least one opening, in particular at least one stress decoupling opening, extending between the first and second main surface, in particular extending from the first to the second main surface or vice versa. The interposer comprises at least two stress decoupling elements, wherein each of the at least two stress decoupling elements comprises a flexible structure formed by a respective portion of the interposer being partially enclosed, in particular laterally enclosed, by one of the at least one opening. Laterally refers to directions parallel to the first and the second main surface.

The sensor assembly further comprises a sensor die connected, in particular mechanically and electrically connected, to the flexible structures, in particular to each of the flexible structures, on the first main surface. The sensor assembly further comprises at least two board connection elements adapted for connecting the sensor assembly to the circuit board, wherein the circuit board is for example not comprised by the sensor assembly. The at least two board connection elements are arranged on the first main surface.

Herein, the expression "flexible structure" describes a structure that is movable or bendable in a direction perpendicular to the main surfaces of the interposer and/or in directions parallel to the main surfaces of the interposer. For example, a part of the flexible structure, in particular a part of the flexible structure being connected to the sensor die, in particular an end of the flexible structure, is movable or bendable in the described way.

Due to the flexibility of the flexible structures, the stress decoupling elements have the effect of decoupling the sensor die from mechanical stress applied to the sensor assembly, for example via the circuit board, the board connection elements and/or the interposer.

Due to the arrangement of the sensor die and the board connection elements on the first main surface of the interposer, a particularly compact setup is achieved. This may lead to a reduced package footprint and/or package height. Furthermore, the sensor die may be protected from external influences or physical damage due to said arrangement.

According to some implementations of the sensor assembly, the sensor die has a first sensor surface, in particular being a first main surface of the sensor die, facing the first main surface of the interposer. The sensor die is connected to the flexible structures at the first sensor surface. The sensor die further has a second sensor surface, in particular being a second main surface of the sensor die, lying opposite to the first sensor surface.

In some implementations of the sensor assembly, the sensor die is connected to the interposer exclusively at the flexible structures. In particular, the sensor die may be connected to the interposer exclusively at discrete connection regions of the flexible structures. In particular, the sensor die is not connected to the first main surface via the complete or essentially complete first sensor surface.

In this way, a decoupling of the sensor die with respect to mechanical stress may be improved.

According to some implementations of the sensor assembly, the sensor die is arranged on the first main surface such that at least two mounting regions of the first main surface are not covered by the sensor die. The at least two board connection elements are for example arranged in the at least two mounting regions, in particular one of the at least two board connection elements is arranged in each of the at least two mounting regions.

According to some implementations of the sensor assembly, the at least two board connection elements are implemented as solder balls. The sensor assembly may then for example be soldered to the circuit board using the solder balls. According to some implementations of the sensor assembly, a total number of the at least one opening is equal to a total number of the at least two stress decoupling elements. In particular, each opening is associated to a single stress decoupling element and vice versa. For each of the at least two stress decoupling elements, the flexible structure is formed by the respective portion of the interposer being partially enclosed by the opening of the at least one opening associated to that stress decoupling element.

According to some implementations of the sensor assembly, each opening of the at least one opening is shaped to partially surround a respective portion of the interposer, each of the partially surrounded portions forming the respective flexible structure of one of the at least two stress decoupling elements. The opening for example exposes the respective portion by surrounding it partially and thereby makes it flexible.

According to some implementations of the sensor assembly, the at least one opening is not filled with a material, in particular a solid material. In this way, the flexibility of the flexible structures may be ensured or improved.

According to some implementations of the sensor assembly, the interposer is a plate of material or a flat or essentially flat piece of material, in particular for carrying the sensor die.

According to some implementations of the sensor assembly, the interposer comprises or is based on a semiconductor material, for example silicon, glass, an epoxy resin, a Bismaleimide-Triazine-, BT-, resin, a BT-epoxy, a composition of a BT-resin and an epoxy resin, ceramics, a composite material, for example a composite of an epoxy resin and glass fibers, for example an FR4 material.

In particular, FR4 or a semiconductor material such as silicon may be particularly suitable in view of structuring the interposer, in particular for generating the at least one opening.

According to some implementations of the sensor assembly, the sensor die and the interposer both comprise the same semiconductor material.

In such implementations, a mismatch between coefficients of thermal expansion, CTEs, of the sensor die and the interposer may be reduced or excluded. Therefore, mechanical stress on the sensor die due to a CTE mismatch may be reduced.

In particular, the interposer may be implemented as a semiconductor die, in particular a passive semiconductor die, with a semiconductor substrate comprising or consisting of the same semiconductor material as a semiconductor substrate of the sensor die. Therein, the expression "the same semiconductor material" does not necessarily imply the same type of doping or a similar or identical doping concentration of the semiconductor substrates of the interposer and the sensor die.

According to some implementations, the sensor assembly further comprises die connection elements connecting the sensor die to the flexible structures.

According to some implementations, the connection of the sensor die to the flexible structures, in particular by means of the die connection elements, is based on solder bonds. In such implementations, the die connection elements may for example be implemented by solder material, for example as solder balls or solder bumps.

According to some implementations, the connection of the sensor die to the flexible structures, in particular by means of the die connection elements, is based on eutectic bonds, in particular gold-gold eutectic bonds. The eutectic bonds are for example achieved by thermocompression bonding. In such implementations, the die connection elements may for example be implemented as stud bumps or electrochemical deposition, ECD, bumps, for example gold stud bumps or gold ECD bumps or other gold bumps.

According to some implementations, the connection of the sensor die to the flexible structures, in particular by means of the die connection elements, is based on adhesive bonds. In such implementations, the die connection elements may for example be implemented by a conductive glue or adhesive.

According to some implementations of the sensor assembly, the sensor die comprises a sensor element for sensing an environmental parameter.

The environmental parameter may for example be pressure, sound, humidity, air humidity, concentration of a gas or concentration of an analyte, magnetic field, rotation speed or rotation frequency and/or acceleration.

According to some implementations, the sensor die and/or the sensor element is implemented as a microelectromechanical system, MEMS.

According to some implementations of the sensor assembly, the sensor die comprises an integrated circuit, IC, including the sensor element.

According to some implementations of the sensor assembly, the sensor element is implemented as a capacitive sensor element, in particular for sensing pressure, humidity or concentration of an analyte or gas. In such implementations, the sensor element may comprise for example one or more flexible membranes for sensing the environmental parameter.

According to some implementations of the sensor assembly, the sensor element comprises one or more Hall sensor elements, one or more inertial sensor elements or one or more gyroscopic sensor elements.

According to some implementations of the sensor assembly, the sensor die comprises the sensor element and the sensor element is configured to generate at least one sensor signal depending on the environmental parameter. The sensor die further comprises a readout circuitry, in particular a CMOS readout circuitry, configured to generate at least one output signal depending on the at least one sensor signal.

In such implementations, where the readout circuitry and the sensor element are both integrated on the same die, for example integrated in a single IC, is not necessary for the interposer to have any active electronic functionality.

According to some implementations of the sensor assembly, the interposer is free from active electronic functionality, in particular has no active electronic functionality. In particular, the interposer is free from any transistor circuitry, CMOS circuitry, readout circuitry and signal processing circuitry.

In view of electronic functionality, the interposer may for example serve exclusively for providing an electrical connection between the sensor die, for example via the die connection means, and the board connection elements.

Due to decoupling of the sensor die with respect to mechanical stress and the lack of active electronic functionality of the interposer, such implementations may have the advantage to reduce an influence of mechanical stress on active electronic circuitry as for example the readout circuitry. Furthermore, an advantage of such implementations may be a reduced manufacturing complexity, in particular for manufacturing the interposer.

According to some implementations of the sensor assembly, the interposer comprises a metallization layer electrically connecting the at least two board connection elements to the sensor die, for example via the die connection elements.

For example, the interposer may have no electronic functionality apart from said connection via the metallization layer. In particular, the interposer may be free from any further metallization layer.

According to some implementations of the sensor assembly, the sensor element is arranged on the first sensor surface facing the first main surface of the interposer.

In such implementations, the sensor element may be protected from external influences, for example pollution or mechanical damage, for example when mounting or soldering the sensor assembly to the circuit board and/or during application. This may be particularly advantageous in implementations where the sensor element comprises the one or more flexible membranes for sensing the environmental parameter.

According to some implementations of the sensor assembly, an air gap is present between the interposer and the sensor die, in particular between the first main surface and sensor die, in particular between the first main surface and first sensor surface.

The air gap may for example be caused by an arrangement of the die connection elements between the interposer and the sensor die. The air gap may for example ensure a correct function of the sensor element, in particular if the sensor element is implemented as capacitive sensor element and comprises for example the one or more flexible membranes.

According to some implementations of the sensor assembly, for each of the flexible structures, a flexibility of the flexible structure is greater than a flexibility of the sensor die, in particular considering bending or deflection in the same direction.

In such implementations, if the sensor assembly is exposed to mechanical stress, the flexible structures may be bent or deflected and a bending or deflection of the sensor die may be avoided. In this way, the sensor die may be effectively decoupled from the remainder of the sensor assembly with respect to the mechanical stress.

According to some implementations of the sensor assembly, a thickness of the flexible structures and/or of the interposer is less than a thickness of the sensor die.

In such implementations, the smaller thickness of the flexible structures or interposer results in the greater flexibility of the flexible structures compared to the sensor die, in particular in implementations where the sensor die and the interposer both comprise the same semiconductor material.

Therein, the thickness of the flexible structures corresponds to a thickness of the flexible structures in a direction perpendicular to the first and the second main surface. A thickness of the sensor die corresponds to a distance between the first and second sensor surface.

In some implementations of the sensor assembly, the thickness of the flexible structures is equal to a thickness of the interposer. The thickness of the interposer is given by a distance between the first and the second main surface.

According to some implementations of the sensor assembly, for each of the flexible structures, an effective spring constant of the flexible structure for a deflection in a defined direction is smaller than an effective spring constant of the sensor die for a deflection in the defined direction.

In this way, an effective decoupling of the sensor die with respect to mechanical stress may be achieved.

According to some implementations, the interposer and the sensor die both have rectangular or essentially rectangular outlines and are rotated with respect to each other, for example by 45° or approximately 45°.

In such implementations, lateral edges of the sensor die are not parallel to lateral edges of the interposer. In particular, the lateral edges of the sensor die include an angle, for example an angle of 45° or approximately 45°, with the lateral edges of the interposer.

Such implementations may allow for a particularly efficient space usage of the sensor assembly and consequently it to a decrease footprint of the sensor assembly.

In some implementations of the sensor assembly, the interposer has a quadratic outline. The sensor die has a rectangular or quadratic outline being inscribed or approximately inscribed in the outline of the interposer.

According to the improved concept, also a sensor arrangement is provided. The sensor arrangement comprises a circuit board and a sensor assembly according to the improved concept. The sensor assembly is mounted on the circuit board, wherein the sensor assembly is connected to the circuit board via the board connection elements.

The circuit board may for example be implemented as a printed circuit board, PCB, a flexible circuit board or a circuit board of another type.

According to some implementations of the sensor arrangement, a further air gap is present between the circuit board and the sensor die.

In such implementations, a distance between the first main surface of the interposer and the circuit board is greater than a height of the board connection elements, for example the solder balls.

Therein, the height of the solder balls after mounting the sensor assembly to the circuit board is for example defined by the height of the board connection elements or solder balls before the mounting, in particular before the soldering and/or a by size of target regions on circuit board. The size of target regions are for example defined via solder resist on the circuit board.

In particular, in such implementations of the sensor arrangement and in corresponding implementations of the sensor assembly, the height of the board connection elements or solder balls before the mounting is greater than a distance between the second sensor surface and the first main surface of the interposer.

In such implementations of the sensor arrangement, the mechanical damage of the sensor die may be avoided due to the further air gap. Furthermore, the sensor die is hanging suspended from the flexible structures and not touching the circuit board. Therefore, a particularly efficient decoupling with respect to mechanical stress may be achieved.

According to the improved concept also a method for manufacturing a sensor assembly for being mounted on a circuit board is provided. The method comprises providing an interposer with a first main surface and a second main surface opposite to the first main surface. The method further comprises generating at least one opening extending between the first and the second main surface, thereby forming at least two stress decoupling elements, each of the at least two stress decoupling elements comprising a flexible structure formed by a respective portion of the interposer being partially enclosed by one of the at least one opening.

The method further comprises attaching at least two board connection elements to the first main surface, the at least two board connection elements being adapted for connecting the sensor assembly to the circuit board. Moreover, the method comprises providing a sensor die and connecting the sensor die to the flexible structures on the first main surface.

According to some implementations, the method further comprises depositing a metallization layer on the first main surface for electrically connecting the at least two board connection elements to the sensor die. In particular, the deposition of the metallization layer is performed before attaching the board connection elements to the first main surface and before connecting the sensor die to the flexible structures.

Further implementations of the method are readily derived from the various implementations of the sensor assembly and the sensor arrangement and vice versa.

BRIEF DESCRIPTION OF THE DRAWINGS

In the following, the disclosure is explained in detail with the aid of exemplary implementations by reference to the drawings. Components that are functionally identical or have an identical effect may be denoted by identical references.

Identical components and/or components with identical effects may be described only with respect to the figure where they occur first and their description is not necessarily repeated in subsequent figures. All features of specific implementations may be combined with other implementations if not stated otherwise.

In the drawings,

FIGS. 1A to 1D show different views of an exemplary implementation of a sensor assembly according to the improved concept;

FIGS. 2A to 2C show different views of a further exemplary implementation of a sensor assembly according to the improved concept;

FIG. 3 shows an exemplary implementation of a sensor arrangement according to the improved concept and a component of a displacement field of the sensor arrangement; and FIG. 4 shows a flowchart of an exemplary implementation of a method for manufacturing according to the improved concept.

DETAILED DESCRIPTION

Figure 1A:
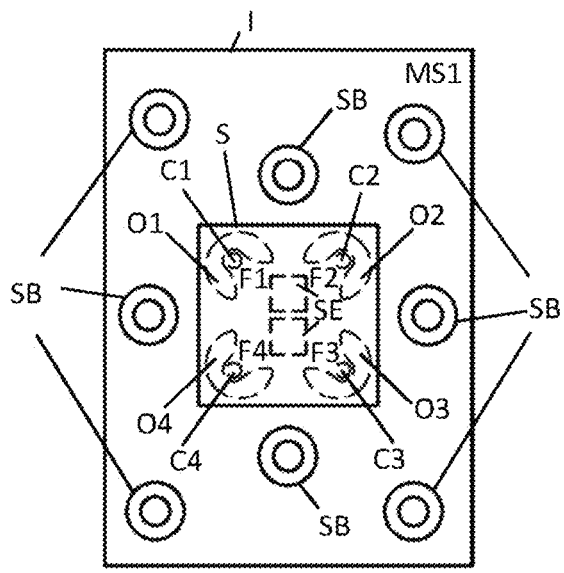

FIG. 1A shows a bottom view of an exemplary implementation of a sensor assembly according to the improved concept.

The sensor assembly comprises an interposer I having for example a rectangular outline, a first main surface MS1 with visible in the bottom view and a second main surface MS2 (see for example FIGS. 1B and 1C) opposite to the first main surface MS1. The interposer I has a number of openings, for example four openings, O1, O2, O3, O4, extending through the interposer in a direction perpendicular to the main surfaces MS1, MS2.

The openings O1, O2, O3, O4 are for example shaped to partially surround or enclose respective portions of the interposer I. In the shown example, the openings O1, O2, O3, O4 are for example shaped in a U-form or approximately in a U-form, wherein the partially surrounded or enclosed portions of the interposer I are located in the inner regions of the U-forms. However, other suitable forms of the openings O1, O2, O3, O4 may be used in alternative implementations. Due to the openings O1, O2, O3, O4 partially enclosing the respective portions of the interposer I, corresponding flexible structures F1, F2, F3, F4, for example arm-like flexible structures are formed by the partially enclosed portions.

The sensor assembly further comprises a sensor die S with a sensor element SE on a first sensor surface. The sensor die S is connected to the first main surface MS1 of the interposer I, in particular to the flexible structures F1, F2, F3, F4. In this way, the flexible structures F1, F2, F3, F4 may effectively acts as stress decoupling elements to decouple the sensor die S from the remainder of the sensor assembly.

For the connection of the sensor die S to the first main surface MS1, the sensor assembly further may comprise die connection elements C1, C2, C3, C4 arranged between the sensor die S and the first main surface MS1. The sensor assembly may for example comprise one die connection element for each of the flexible structures F1, F2, F3, F4. The die connection elements C1, C2, C3, C4 may for example be arranged at respective end positions of the flexible structures F1, F2, F3, F4, for example in the inner regions of the U-forms, if applicable.

The sensor die S is for example connected to the flexible structures F1, F2, F3, F4 by the die connection elements C1, C2, C3, C4. Due to arrangement of the die connection elements C1, C2, C3, C4 between the sensor die S and the first surface MS1, there may for example be an air gap G (see FIGS. 1B and 2C) present between the sensor die S and the first main surface MS1.

The die connection elements C1, C2, C3, C4 may for example be implemented as stud bumps or ECD bumps, for example gold stud bumps or gold ECD bumps. In such implementations, the connection between the die connection elements C1, C2, C3, C4 and the sensor die S and the connection between the die connection elements C1, C2, C3, C4 and the first main surface MS1 may be achieved by eutectic bonding, in particular thermocompression bonding. Alternatively, solder balls may be used for the die connection elements C1, C2, C3, C4.

The sensor assembly further comprises at least two board connection elements SB attached to the first main surface MS1. The board connection elements SB are adapted for connecting the sensor assembly to a circuit board (not shown). For example, the board connection elements SB may be implemented as solder balls. The interposer I may comprise a metallization layer (not shown), for example on the first main surface MS1, connecting the sensor die S, in particular via the die connection elements C1, C2, C3, C4, to the board connection elements SB.

In particular, the sensor die S may be connected to the first main surface MS1 exclusively via the flexible structures F1, F2, F3, F4. Due to the increased flexibility of the flexible structures, which may for example be enhanced or achieved in some implementations by choosing a lower thickness of the interposer I compared to the sensor die S, mechanical stress acting for example on the interposer I may not or only to a limited or reduced extent be transferred to the sensor die S. In this way, the sensor die S may be effectively decoupled with respect to mechanical stress.

For example to increase the flexibility of the flexible structures F1, F2, F3, F4, in particular with respect to the flexibility of the sensor die S, and therefore improve the decoupling of the sensor die S, a thickness of the flexible structures F1, F2, F3, F4, in particular a thickness of the interposer I, may be less than a thickness of the sensor die S.

In a non-limiting example, the sensor die S may for example be a semiconductor, in particular silicon, die with a thickness of approximately 200 µm. The thickness of the interposer I and the flexible structures F1, F2, F3, F4 may for example be approximately 100 µm. Therein, the interposer I may be for example a passive semiconductor, in particular silicon, die.

Furthermore, the first sensor surface carrying the sensor element SE may for example face the first main surface MS1. Consequently, the sensor element SE may be protected from external influences such as mechanical damage or pollution. The sensor element SE may for example be implemented as a MEMS sensor element, for example may comprise one or more flexible membranes for capacitive measurement of an environmental parameter, such as pressure, humidity or concentration of a gas or another analyte.

The interposer I may for example be implemented as a passive element being free from any and electronic functionality apart from providing the electronic connection between the sensor die S and the board connection elements SB.

For example, the interposer I may be implemented as a passive semiconductor die comprising or being based on the same semiconductor material as the sensor die S. In this way, influences of a mismatch of the CTEs of the interposer I and sensor die S and resulting mechanical stress may be reduced.

In the example of FIG. 1A, the sensor die S has for example a rectangular outline, in particular a quadratic outline. The edges of the sensor die S are for example parallel to respective edges of the interposer I. In alternative implementations, however, the edges of the sensor die S may be rotated with respect to the edges of the interposer I, see for example FIGS. 2A to 2C.

Figure 1B:
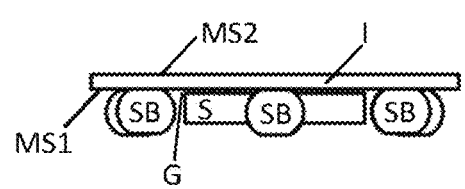

FIG. 1B shows a side view of a sensor assembly according to the improved concept, for example the sensor assembly of FIG. 1A.

The air gap G is for example present between the sensor die S and the first main surface MS1. In the side view of FIG. 1B, one can see that for example a size, in particular a height, of the board connection elements SB is greater than a distance between a second sensor surface of the sensor die S and the first main surface MS1. Therein, the second sensor surface is opposite to the first sensor surface and faces away from the interposer I.

Consequently, in such implementations a further air gap (not shown) may be present between the sensor die S and a circuit board of a corresponding sensor arrangement according to the improved concept, wherein the sensor assembly is mounted to the circuit board via the board connection elements SB. Thus, the sensor die S may for example not touch the circuit board in such a sensor arrangement.

Figure 1C:
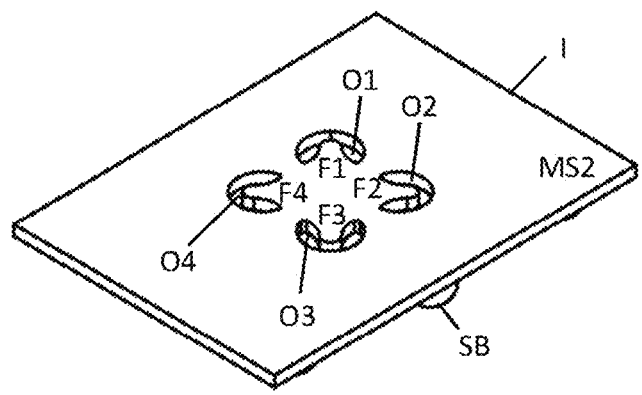
Figure 1D:
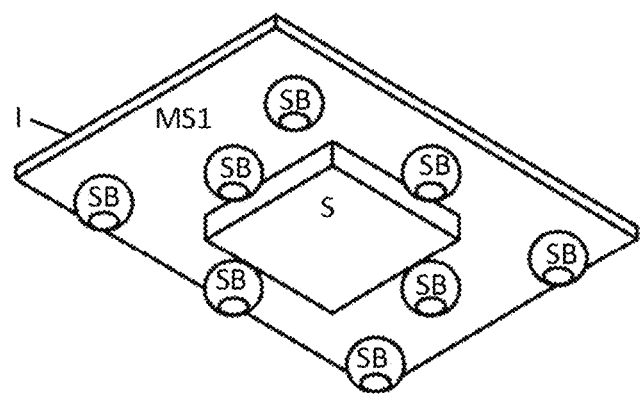

FIGS. 1C and 1D show different perspective views of the sensor assembly of FIG. 1A.

Figure 2A:
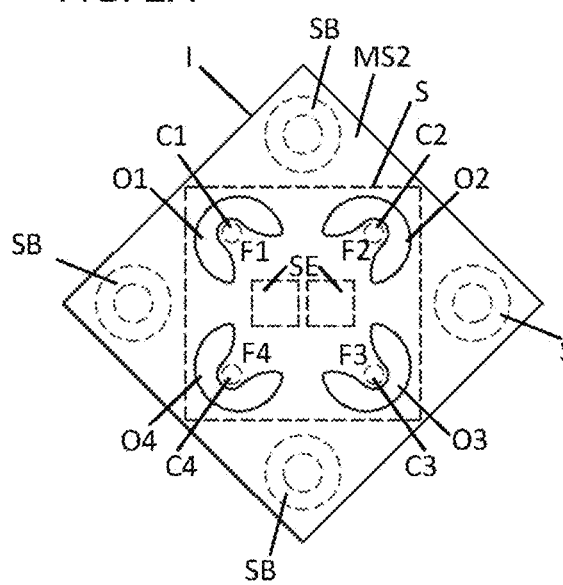

FIG. 2A shows a top view of a further exemplary implementation of a sensor assembly according to the improved concept, that is a view from a side opposite to the sensor die S. The sensor assembly is based on the sensor assembly of FIG. 1A.

In the implementation of FIG. 2A, the sensor die S and the interposer I both have for example quadratic or approximately quadratic outlines. The sensor die S and the interposer I, in particular their lateral edges, are rotated with respect to each other for example by an angle of 45° or approximately 45°. In this way, a footprint of the sensor assembly may be reduced.

Furthermore, a length of the lateral edges of the interposer I may for example be as small as possible such that the sensor die S still fits, in particular fits completely, on the first main surface MS1. Consequently, a footprint of the sensor assembly may be only slightly larger than a footprint of the single sensor die S. In the exemplary case of a rotation of 45°, the length of the lateral edges of the interposer I may be greater than a length of the lateral edges of the sensor die S by a factor of $\sqrt{2}$ or approximately $\sqrt{2} \approx 1.4$, in particular up to manufacturing tolerances.

Figure 2B:
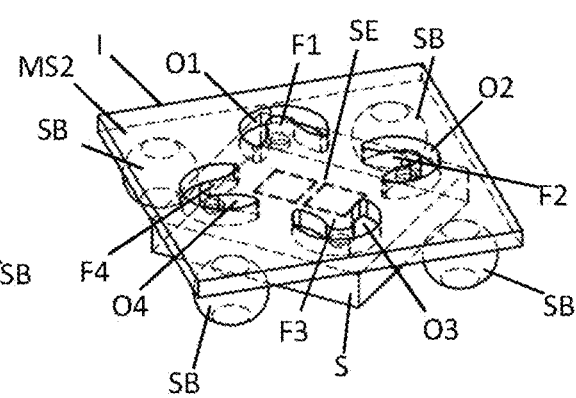

FIG. 2B shows a perspective view of the sensor assembly of FIG. 2A.

Figure 2C:
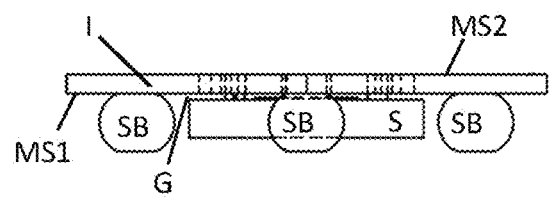

FIG. 2C shows a side view of the sensor assembly of FIG. 2A.

Figure 3:
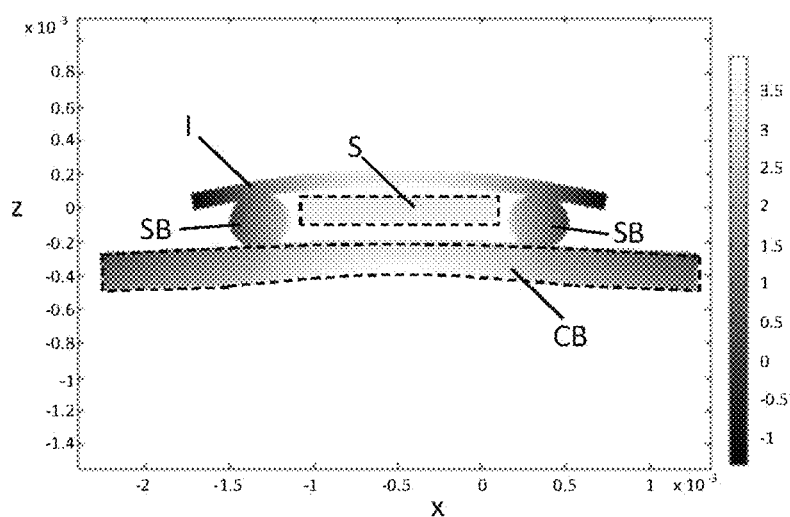

FIG. 3 shows an exemplary implementation of a sensor arrangement according to the improved concept and a component of a displacement field of the sensor arrangement.

The sensor arrangement of FIG. 3 comprises a sensor assembly according to the improved concept, for example as described with respect to FIGS. 1A to 2C, and a circuit board CB. The sensor assembly is mounted to the circuit board CB by attaching, in particular soldering, the board connection elements SB, in particular solder balls, to the circuit board CB.

The x- and z-axes of FIG. 3 show positions in the respective directions in units of meters. In the example of FIG. 3, a mechanical force is exerted on the circuit board, in particular in z-direction, as can be seen from a bending of the, otherwise for example planar, circuit board CB. Consequently, mechanical stress acts on the circuit board CB and on the sensor assembly. Thus, for example also the interposer I is bent correspondingly.

Due to the flexibility of the flexible structures F1, F2, F3, F4, in particular the increased flexibility compared to the sensor die S, and the resulting flexible mounting of the sensor die S to the interposer I, the sensor die S may for example be not bent or a bending of the sensor die due to the exerted force may be reduced.

FIG. 3 further shows in grey scales simulation results of a component, in particular z-component, of a displacement field in units of µm resulting from the exerted force. The displacement field represents a displacement of points of the sensor arrangement under influence of the exerted force with respect to a situation where no force is exerted. Thus, the z-component of the displacement field or differences in the—component of the displacement field may represent a measure for a spatial distribution of the mechanical stress.

Due the described flexible mounting of the sensor die S, the sensor die S is effectively decoupled from the rest of the sensor arrangement with respect to mechanical stress. In particular, the value of the z-component of the displacement field is approximately constant within the region corresponding to the sensor die S indicating a low mechanical stress in this region. It is pointed out that a non-zero and approximately constant value of the displacement field is for example due to a translational movement of the whole sensor die S due to the bending of the interposer I. In particular, such a constant value does not translate to mechanical stress.

FIG. 4 shows a flowchart of an exemplary implementation of a method for manufacturing a sensor assembly according to the improved concept, for example a sensor assembly as in one of FIGS. 1A through 3.

In block A1, a wafer comprising the sensor die S, for example a plurality of such sensor dice S, is provided. The providing of the wafer may comprise processing steps, in particular front end processing steps to manufacture the sensor die S for example including the sensor element SE.

In block A2, the die connection elements C1, C2, C3, C4, for example stud bumps or ECD bumps, are applied to the first sensor surface.

In block A3, the individual sensor dice S are individualized by a singulation or dicing process.

In block B1, a wafer or substrate comprising the interposer I, for example a plurality of such interposers I, is provided, for example a semiconductor, glass, epoxy, BT-epoxy, FR4 or ceramics wafer or substrate. Furthermore, the metallization layer is generated on the first main surfaces MS1, for example by single layer routing. The single layer routing may include opening bond pads for connecting the die connection elements C1, C2, C3, C4 and/or the board connection elements SB to the first main surface MS1.

In block B2, the openings O1, O2, O3, O4 are for example etched in the interposers I. For the etching, for example deep reactive-ion etching, DRIE, or another etch process, in particular anisotropic etch process, may be used. For example, after finishing the etching, the openings O1, O2, O3, O4 may not extend through the whole thickness of the wafer. It is referred to block B4 in this respect.

In block B3, die connection pads for connecting the die connection elements C1, C2, C3, C4 are deposited on the first main surface MS1. In particular, if the die connection elements C1, C2, C3, C4 are connected to the first main surface by eutectic or thermocompression bonding, for example when the die connection elements C1, C2, C3, C4 are implemented as stud bumps or ECD bumps, the die connection pads may be gold pads. In implementations using solder balls as die connection elements C1, C2, C3, C4, the die connection pads may be implemented as under-bump metallization.

Furthermore, in block B3, also board connection pads for connecting the board connection elements SB are deposited on the first main surface MS1. The board connection pads may be implemented as under-bump metallization, in particular if solder balls are used for the board connection elements SB.

In block B4, a wafer thinning process is performed to achieve the final thickness of the interposer I and the flexible structures F1, F2, F3, F4. In particular, the wafer is thinned at least to an extent such that the openings O1, O2, O3, O4 extend through the whole thickness of the wafer after the wafer thinning of block B4.

In block B5, the board connection elements SB are deposited on the first main surface MS1 in a ball drop step. Then, the board connection elements SB may be attached to the first main surface MS1 by a first solder process, in particular reflow solder process.

After the steps of blocks A3 and B5 are finished, the sensor die S is bonded in block AB1 to the interposer I for example by eutectic or thermocompression bonding or by soldering, depending on the used type of die connection elements C1, C2, C3, C4.

In block AB2, the individual sensor assemblies are individualized by a further singulation or dicing process.

In a second solder process, the sensor assembly may be soldered to the circuit board CB to form for example a sensor arrangement according to the improved concept.

By means of a sensor assembly, sensor arrangement and/or method according to the improved concept, the influence of mechanical stress on the sensor die S introduced for example by external forces or generated internally for example due to CTE mismatch may be reduced. Hence, for example degradation of sensor performance or physical damage of the sensor die S or the sensor element SE, which may be a fragile structure, for example MEMS structure, may be avoided. The improved concept achieves this for example by a mechanical decoupling of the sensor die S from the interposer I and/or the circuit board CB.

At the same time, for example a low package footprint may be maintained. In particular, an overall package footprint and/or height may be only marginally larger than the size of the sensor die S.

From a manufacturing perspective, the interposer I advantageously requires only limited processing, for example for generating the openings or the metallization layer. No through-semiconductor-vias or trenches may be necessary and the full area of the interposer I may be available for generating the stress decoupling elements, in particular the flexible structures F1, F2, F3, F4. For example die-to-wafer stacking of the sensor die S to the interposer I may be done as a batch process.

A fragile surface of the sensor die S, for example the sensor element SE, for example implemented as a MEMS membrane, may be protected by the interposer I from physical harm, while there may still the air gap G, which may be important for example for pressure or gas sensors.

In particular, the described packaging concept is applicable for sensor assemblies where the sensing element SE and readout circuitry are integrated on a single die.

The invention claimed is:

1. A sensor assembly for being mounted on a circuit board, the sensor assembly comprising:
an interposer comprising:
a first main surface, a second main surface opposite to the first main surface and at least one opening extending between the first and the second main surface; and
at least two stress decoupling elements, wherein each of the at least two stress decoupling elements comprises a flexible structure formed by a respective portion of the interposer being partially enclosed by one of the at least one opening;
a sensor die connected to the flexible structures on the first main surface; and
at least two board connection elements adapted for connecting the sensor assembly to the circuit board, the at least two board connection elements being arranged on the first main surface,
wherein for each of the flexible structures, a flexibility of the flexible structure is greater than a flexibility of the sensor die.

2. The sensor assembly according to claim 1, wherein the sensor die comprises a sensor element configured to generate at least one sensor signal depending on an environmental parameter and the sensor die further comprises a readout circuitry configured to generate at least one output signal depending on at least one sensor signal.

3. The sensor assembly according to claim 1, wherein the sensor element is arranged on a first sensor surface of the sensor die facing the first main surface.

4. The sensor assembly according to claim 1, wherein an air gap is present between the interposer and the sensor die.

5. The sensor assembly according to claim 1, wherein the interposer is free from active electronic functionality.

6. The sensor assembly according to claim 1, wherein the interposer comprises a metallization layer electrically connecting the at least two board connection elements to the sensor die.

7. The sensor assembly according to claim 1, wherein a thickness of the flexible structures is less than a thickness of the sensor die.

8. The sensor assembly according to claim 1, wherein for each of the flexible structures, an effective spring constant of the flexible structure for a deflection in a defined direction is smaller than an effective spring constant of the sensor die for a deflection in the defined direction.

9. The sensor assembly according to claim 1, wherein the interposer and the sensor die have rectangular or essentially rectangular outlines, wherein an orientation of the rectangular or essentially rectangular outline of the interposer is rotated relative to an orientation of the rectangular or essentially rectangular outline of the sensor die.

10. The sensor assembly according to claim 1, wherein the sensor die and the interposer both comprise the same semiconductor material.

11. The sensor arrangement comprising a circuit board and a sensor assembly according to claim 1 mounted on the circuit board, wherein the sensor assembly is connected to the circuit board via the board connection elements.

12. The sensor arrangement according to claim 11, wherein a further air gap is present between the circuit board and the sensor die.

13. A method for manufacturing a sensor assembly for being mounted on a circuit board, the method comprising:
providing an interposer with a first main surface and a second main surface opposite to the first main surface;
generating at least one opening extending between the first and the second main surface, thereby forming at least two stress decoupling elements, each of the at least two stress decoupling elements comprising a flexible structure formed by a respective portion of the interposer being partially enclosed by one of the at least one opening;

attaching at least two board connection elements to the first main surface, the at least two board connection elements being adapted for connecting the sensor assembly to the circuit board; and providing a sensor die and connecting the sensor die to the flexible structures on the first main surface, wherein for each of the flexible structures, a flexibility of the flexible structure is greater than a flexibility of the sensor die.

14. The method according to claim 13, further comprising depositing a metallization layer on the first main surface for electrically connecting the at least two board connection elements to the sensor die.

15. A sensor assembly for being mounted on a circuit board, the sensor assembly comprising:
an interposer comprising:
a first main surface, a second main surface opposite to the first main surface and at least one opening extending between the first and the second main surface; and
at least two stress decoupling elements, wherein each of the at least two stress decoupling elements comprises a flexible structure formed by a respective portion of the interposer being partially enclosed by one of the at least one opening;
a sensor die connected to the flexible structures on the first main surface; and
at least two board connection elements adapted for connecting the sensor assembly to the circuit board, the at least two board connection elements being arranged on the first main surface,
wherein for each of the flexible structures, an effective spring constant of the flexible structure for a deflection in a defined direction is smaller than an effective spring constant of the sensor die for a deflection in the defined direction.

16. The sensor assembly according to claim 15, wherein the sensor die comprises a sensor element configured to generate at least one sensor signal depending on an environmental parameter and the sensor die further comprises a readout circuitry configured to generate at least one output signal depending on at least one sensor signal.

17. The sensor assembly according to claim 15, wherein the interposer comprises a metallization layer electrically connecting the at least two board connection elements to the sensor die.

18. The sensor assembly according to claim 15, wherein for each of the flexible structures, a flexibility of the flexible structure is greater than a flexibility of the sensor die.

19. The sensor assembly according to claim 15, wherein the interposer and the sensor die have rectangular or essentially rectangular outlines, wherein an orientation of the rectangular or essentially rectangular outline of the interposer is rotated relative to an orientation of the rectangular or essentially rectangular outline of the sensor die.

20. The sensor assembly according to claim 15, wherein the sensor die and the interposer both comprise the same semiconductor material.

* * * * *